(12) United States Patent
Franke et al.

(10) Patent No.: US 6,891,229 B2
(45) Date of Patent: May 10, 2005

(54) INVERTED ISOLATION FORMED WITH SPACERS

(75) Inventors: Andrea Franke, Austin, TX (US); Jonathan Cobb, Austin, TX (US); John M. Grant, Austin, TX (US); Al T. Koh, Austin, TX (US); Yeong-Jyh T. Lii, Austin, TX (US); Bich-Yen Nguyen, Austin, TX (US); Anna M. Phillips, Manchaca, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 85 days.

(21) Appl. No.: 10/426,296

(22) Filed: Apr. 30, 2003

(65) Prior Publication Data

US 2004/0217437 A1 Nov. 4, 2004

(51) Int. Cl.$^7$ .......................... H01L 27/01; H01L 29/00
(52) U.S. Cl. ........................... 257/354; 257/506
(58) Field of Search ................ 257/66, 353, 354, 257/506; 438/158, 412

(56) References Cited

U.S. PATENT DOCUMENTS

| | | | |
|---|---|---|---|
| 5,498,567 A | * 3/1996 | Klose et al. | ............... 438/151 |
| 5,849,077 A | 12/1998 | Kenney | |
| 5,960,270 A | * 9/1999 | Misra et al. | ............... 438/197 |
| 6,010,930 A | 1/2000 | Keller et al. | |
| 6,060,385 A | 5/2000 | Givens | |
| 6,207,517 B1 | 3/2001 | Muller | |
| 6,207,577 B1 | 3/2001 | Wang et al. | |
| 6,362,071 B1 | 3/2002 | Nguyen et al. | |
| 6,475,916 B1 | * 11/2002 | Lee et al. | ............... 438/706 |
| 6,664,195 B2 | * 12/2003 | Jang et al. | ............... 438/745 |
| 6,686,630 B2 | * 2/2004 | Hanafi et al. | ............... 257/366 |

* cited by examiner

Primary Examiner—David S. Blum

(57) ABSTRACT

A method of forming a semiconductor device so as to provide the device inverted isolation trenches with convex sidewalls. Initially, a plurality of composite isolation posts (50, 51) are formed on a substrate (40) through successive deposition, lithography, and etching steps. The posts comprise a bottom layer (501, 502) of silicon dioxide and an overlying etch-stop layer of silicon nitride (502, 512). An insulating material (60) is then deposited over the isolation posts and areas of the substrate. Isolation structures (70,71) are established by etching the insulating material to form convex sidewall spacers (701,702, 711, 712) at the vertical walls of the isolation posts. Active areas (80) between spacers are filled with semiconductor material. In an embodiment, a strained cap layer (101) may be imposed on the active areas. The strained cap layer has a lattice constant that is different from the lattice constant of the semiconductor material.

20 Claims, 3 Drawing Sheets

INVERTED ISOLATION FORMED WITH SPACERS

BACKGROUND OF THE INVENTION

1. Field of the Invention

The subject invention relates generally to the design and fabrication of semiconductor devices and, more particularly, to a technique for the formation of isolation regions between active areas in a semiconductor substrate, wherein the area available for the formation of active devices is optimized and the threading of crystalline defects to the substrate surface is diminished.

2. Related Art

The design and fabrication of semiconductor devices routinely require that isolation regions be provided in order to physically and electrically decouple active areas that are formed in a semiconductor substrate. Specifically, isolation is necessary to prevent conduction in the form of leakage current between devices. In the context of CMOS technology, it is regularly necessary to isolate areas of the substrate that contain N-channel transistors from areas that contain P-channel transistors. That is, isolation areas are interposed between, for example, an N-channel MOS transistor that is formed in a P-type well and an adjacent P-channel MOS transistor that is formed in an N-type well or substrate. Similarly, isolation is required between adjacent MOS transistors of the same conductivity type. For any semiconductor technology, the metrics applicable to isolation techniques include: circuit density, process complexity, yield, planarity and severity of parasitic effects.

A standard, and somewhat primitive, approach to the provision of isolation between active devices in a semiconductor substrate relies on the local oxidation of silicon (LOCOS) to isolate active areas. FIG. 1 is a cross-sectional view of a device 10 formed with a standard LOCOS process. The LOCOS process begins with the formation of a thin oxide layer 11 on the semiconductor substrate 12, followed by the deposition of a thin $Si_3N_4$ film 13. Subsequent to patterning the nitride layer with photoresist, a field implant is performed. The photoresist is then stripped and the substrate is oxidized. The nitride serves as a diffusion barrier so that oxidation is inhibited in selected regions that ultimately become active areas of the semiconductor device.

As is well known, the LOCOS process results in a "bird's beak" isolation profile that is characterized by a surface bump and a narrowing tail into the active area. The length of the bird's beak reduces the effective width of the active area and also contributes to the narrow-channel effect. The narrow-channel effect is known to skilled artisans as a subtle consequence of the LOCOS process, resulting from the encroachment by the field oxide into the active area. Specifically, diffusion of dopants from the implanted field oxide areas into the edges of the active region (illustrated by the dashed lines in FIG. 1) tends to increase the threshold voltage of the device. Furthermore, diffusion of field oxide dopants reduces the transistor channel width, thereby reducing the device drive current. The narrow-channel effect is especially detrimental in extremely dense technologies such as memories. For these and other reasons, it appears clear that LOCOS, as well as it's derivative isolation techniques, is contraindicated as an isolation mechanism in designs with transistor densities greater than approximately $10^6/cm^2$.

Accordingly, alternative approaches have been developed in response to the shortcomings of LOCOS. One such alternative, trench isolation, is predicated on etching away part of the substrate and refilling the etched area (trench) with an insulator, almost invariably deposited oxide. It has been found that the profile of the isolation trenches influences a number of device performance parameters, including the level of leakage current that occurs at the junction between devices. For example, an isolation trench having substantially vertical sidewalls is susceptible to the formation of keyhole voids during subsequent filling of the trench with an oxide insulator. Keyholes (voids) adversely affect reliability and are not acceptable in the fabrication of semiconductor devices.

As an alternative to vertical trenching, tapered trenches have been implemented to extenuate the effects of keyholes during the formation of isolation regions. Tapered isolation trenches, such as the isolation trench depicted in FIG. 2, are formed that exhibit a profile having a width that varies inversely with the depth of the trench from the substrate surface. That is, the isolation trench is wider at the surface of the substrate than at a depth into the substrate.

As depicted in FIG. 2, pertinent aspects of a semiconductor device that incorporates tapered trench isolation include a substrate 21, on which there are formed a plurality of active areas 23. (Structural details regarding specific functional devices that may be formed in active areas 23 have been omitted here for the sake of brevity and clarity.) The active areas are mutually isolated by tapered trench structures 22. (Only one such trench structure is depicted.) Each trench structure 22 is defined by a pair of tapered sidewalls 221 that extend from surface 231 of a respectively adjacent active area on semiconductor substrate 21.

It has been determined that tapering of the isolation trench from wider at the surface to narrower at the bottom exacerbates the vulnerability of active devices to leakage between adjacent transistors. Tapering in this manner results in a reduction in the distance between adjacent transistors and is therefore attended by a greater susceptibility to leakage. Furthermore, when device dimensions are scaled, the dimensions of the isolation trenches are scaled proportionately. Both the width and the depth of the isolation trench must be reduced concomitantly in order to maintain the aspect ratio of the trench. Scaling therefore minimizes the distance between adjacent devices and further aggravates leakage effects. Tapered trenches also tend to compromise the packing density of devices on a wafer.

Reduction of the trench depth has also been entertained as a technique to obviate the effects of keyholes. That is, it has been found that keyholes can be avoided in the formation of isolation regions by reducing the aspect ratio of the isolation trench. However, reducing the isolation trench depth also diminishes the distance between adjacent transistors. As suggested above, in the event that more aggressive design rules are imposed, the trench depth must be scaled proportionally to maintain substantially the same aspect ratio in an effort to limit the generation of keyholes.

The above-identified difficulties associated with existing vertical trench isolation structures are, in large part, remediated by the isolation technique disclosed in U.S. Pat. No. 6,362,071, Method for Forming a Semiconductor Device With an Opening in a Dielectric Layer, that patent assigned to the assignee of this patent application. As may be seen in FIG. 3, the approach introduced there results in the formation of inverted isolation structures 32 that are disposed between active areas 31 on a semiconductor substrate 30. Each of the isolation structures 32 is a composite that comprises a bottom layer 321 on substrate 30, and a top layer 322 on bottom layer 321. Bottom layer 321 may be thermally grown silicon dioxide or may be an oxide formed by a chemical vapor deposition (CVD). Top layer 322 serves as a stop layer for an etching step or a chemical-mechanical polishing (CMP) step undertaken in the fabrication of the device. Examples of materials that are appropriate for top layer 322 include silicon nitride, aluminum oxide, or any other material effective to retard the relevant etching or CMP step.

A salient characteristic of the isolation structure depicted in FIG. 3 is the "inverted" nature of the isolation trench profile. Conventional vertical trench isolation structures are similar in that the exterior angle formed by a trench sidewall with the respectively adjacent active area is greater than 90 degrees (obtuse). This relationship may be seen in FIG. 2, where trench sidewall 221 forms an obtuse angle 24 with the surface 231 of active area 23. In contradistinction, the inverted structure of FIG. 3 results in a corresponding angle (between trench sidewall and surface of the active area) that is less than 90 degrees (acute). This geometry may be seen in FIG. 3, wherein the intersection of trench sidewall 323 with surface 311 forms an angle 33 that is less than 90 degrees. (A caveat is in order here. FIG. 2 and FIG. 3 imply a degree of sidewall sloping that has been exaggerated there solely for pedagogical purposes. With respect to both the conventional vertical trench structure of FIG. 2, as well as the inverted structure of FIG. 3, the degree of sidewall sloping off vertical is almost always less than 10 degrees and is, therefore, largely undetectable by visual inspection. For example, obtuse angle 24 is normally no greater than 100 degrees; acute angle 33 is normally no less than 80 degrees.)

In one embodiment, the inverted trench profile of FIG. 3 is realized through an etch process wherein a gas containing carbon and fluorine is combined with oxygen. The introduction of oxygen, with a carbon and fluorine containing gas, effects a resist erosion, thereby facilitating a tapered etch profile. Specific examples of gases that contain both carbon and fluorine and that may be used in the target process include: $CHF_3$, $CF_4$, $C_2F_6$, $C_3F_8$ and $C_4F_8$. Any one of a number of suitable commercially available etch chambers may be used in this process. A typical etch process condition is: 1100 W, 200 mtorr, 30 gauss, 50 sccm $CHF_3$, 10 sccm $O_2$, and 50 sccm Ar.

Although the salutary nature of the above-described inverted trench isolation technique cannot be gainsaid, a number of difficulties inhere therein. The dry plasma etching step that is required to form the inverted trench sidewalls presents a process control challenge. This is due in part to the nature of conventional dry plasma etches, which are customarily designed to produce anisotropic etch profiles, rather than the sloped profile dictated by the inverted trench. In addition, the inverted trench fabrication process that is described above has in practice been found to produce trenches that vary in width across the semiconductor wafer, causing the width of the associated active areas to vary accordingly. Finally, the linearly varying slope of the trench sidewalls has been correlated to threading of crystalline defects to the wafer surface. Although threading defects are in all instances undesirable, the minimization of threading dislocation density is particularly critical to SiGe epitaxial devices, in which an uppermost strained Si layer is formed to increase the mobility of holes in P-channel devices and the mobility of electrons in N-channel devices.

Accordingly, there remains a persisting need for improvement in isolation techniques available for semiconductor device fabrication. The desiderata attributable to a more nearly optional isolation structure include: maximization of active device density, ease of fabrication, provision of adequate isolation, resistance to the creation and propagation of crystalline defects, and uniformity across the semiconductor wafer.

BRIEF DESCRIPTION OF THE DRAWINGS

The subject invention for Inverted Isolation Formed With Spacers may be better understood by, and its many features, advantages and capabilities made apparent to, those skilled in the art with reference to the Drawings that are briefly described immediately below and attached hereto, in the several Figures of which identical reference numerals (if any) refer to identical or similar elements and wherein.

Figure 1:
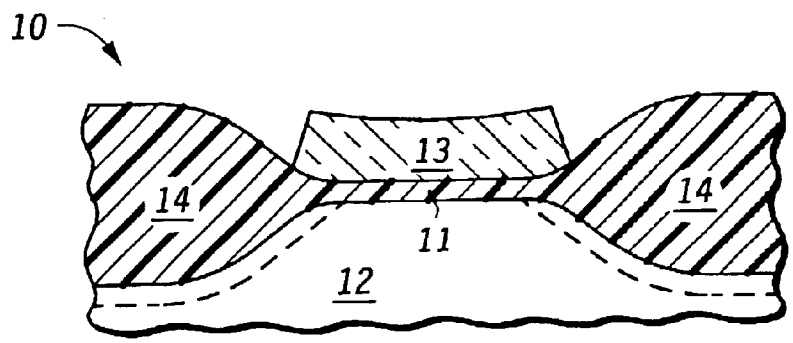
FIG. 1 is a cross-sectional view of a semiconductor device in which isolation is effected between active devices by the conventional local oxidation of silicon (LOCOS) process. In particular, FIG. 1 graphically illustrates the "bird's beak" effect that attends LOCOS isolation.

Skilled artisans appreciate that elements in Drawings are illustrated for simplicity and clarity and have not (unless so stated in the Description) necessarily been drawn to scale. For example, the dimensions of some elements in the Drawings may be exaggerated relative to other elements to promote and improve understanding of embodiments of the invention.

DETAILED DESCRIPTION OF THE PREFERRED EMBODIMENT(S)

For a thorough understanding of the subject invention, a semiconductor device and fabrication process that provide Inverted Isolation Formed With Spacers, reference is made to the following Detailed Description, which includes the appended claims, in connection with the above-described Drawings.

In a manner that will be made eminently clear below, the subject invention inheres, in one form, is an improved technique for establishing isolation areas between active devices in a semiconductor substrate. Composite isolation posts are erected at predetermined positions on a semiconductor substrate. The isolation posts result from the successive formation of at least two layers of insulating material on the semiconductor substrate, followed by photolithographic patterning. In one embodiment, the first insulating layer is silicon dioxide and the second insulating layer is silicon nitride. Sidewall spacers are disposed adjacent to the vertical walls of each of the posts so that isolation structures are formed that include inverted trenches with convex walls.

The trenches are inverted in the sense that the trenches are wider at the substrate surface than at increasing depths into the substrate. Active areas between the sidewalls are filled with semiconductor material, followed by a CMP step. The technique is noteworthy in that it results in increased active area on the substrate, so as to at once enhance circuit packing density while limiting leakage current. The fabrication process is predicated on an easily controllable etch step. The convex nature of the sidewalls reduces threading dislocation density, which is known to be crucial in SiGe epitaxy to fabricate strained Si, high-mobility devices.

An appreciation of the subject invention, in its various aspects and attributes, may be conveniently acquired in the context of the fabrication process in which the subject inverted trenches are formed. To that end, attention is now directed to FIGS. 4 through 9, constituting a process flow schematic that enables the formation of inverted isolation trenches independent of an intractable plasma etching step.

Figure 4:
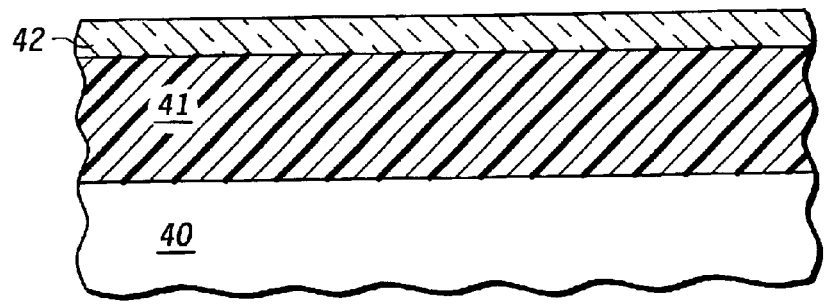
FIG. 4 through FIG. 9 constitute a process flow schematic that depicts in sequence process steps in which spacers are deployed in the formation of inverted isolation trenches. In a notable aspect, the process results in an inverted isolation structure having convex sidewalls.

Initially, at FIG. 4, a first insulating layer 41 is formed on substrate 40. Substrate 40 may be monocrystalline SiGe, silicon-on-insulator (SOI), gallium nitride, gallium arsenide, indium gallium arsenide, indium phosphide, or another semiconductor (or semiconductor compound) material. Insulating layer 41 may be a single layer of silicon dioxide ($SiO_2$) that is thermally grown or that is formed by CVD. Subsequent to the formation of layer 41, a second insulating layer 42 is formed over first insulating layer 41. Layer 42 may be silicon nitride ($Si_3N_4$) that is formed by a low-pressure CVD (LPCVD) step. Layer 42 will be seen to operate as a stop layer to a subsequent etching step.

Figure 5:
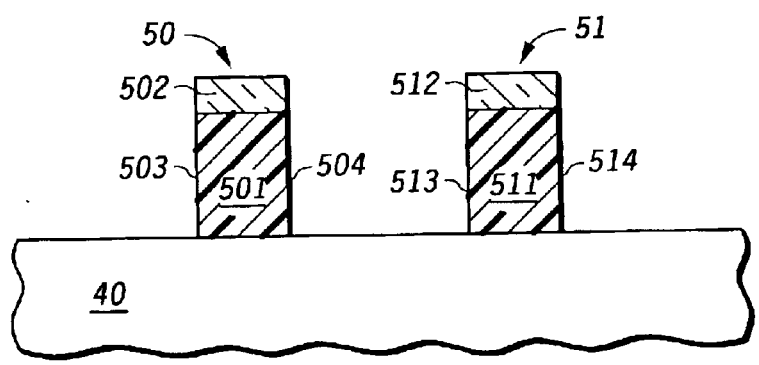

In FIG. 5, the first and second insulating layers are photolithographically patterned with a mask (not shown) that represents a negative of intended active areas. Specifically, photoresist is deposited over layer 42 and is exposed through a mask that defines the respective active and isolation areas of the device. An etching step results in a plurality of isolation posts 50 and 51 disposed at predetermined positions on substrate 40. Each isolation post is a composite that comprises a respective first insulating layer (501, 511) that is disposed on substrate 40 and a respective second insulating layer (502, 512) superjacent a respective first insulating layer (501, 511). As indicated above, the first insulating layer (501,511) may be $SiO_2$ and the second insulating layer (502,512) may be $Si_3N_4$. In addition, each of the posts is defined by a respective pair of substantially vertical sidewalls (503, 504) and (513, 514).

At this point it is appropriate to note that the dimensions of isolation posts 50, 51, etc. need not be identical in all respects. Although, in general, the respective heights of posts 50 and 51 must conform in order to maintain the planarity of the substrate surface, the horizontal cross-sections of posts 50 and 51 may be different, as may be appropriate to the device design. Therefore, regardless of the impression conveyed by FIG. 5, as well as by following FIGS. 6 through 10, the invention contemplates that the width of, for example, post 50 may differ markedly from the width of post 51. If so, this relative geometry will be reflected in subsequent stages of formation of the isolation structure.

Figure 6:
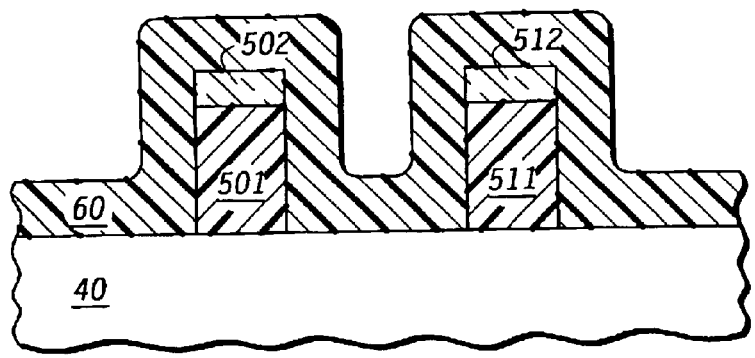

In FIG. 6, a third insulating layer 60 is deposited over the isolation posts 50 and 51 and over exposed areas of substrate 40. Layer 60 may again be $SiO_2$ and is deposited to a predetermined thickness of, for example, 800 angstroms. At present, low-pressure chemical vapor deposition (LPCVD) appears to be the preferred technique in that LPCVD it affords superior sidewall coverage for $SiO_2$ layer 60. However, plasma-enhanced CVD (PECVD) and high-density plasma (HDP) etching are also available as alternative deposition techniques, although the resulting process may prove to be less robust in that the predicted sidewall coverage may be less favorable. Layer 60 is seen to cover top layers 502 and 512 of the isolation posts and to at least partially fill the volume between adjacent posts.

Figure 7:
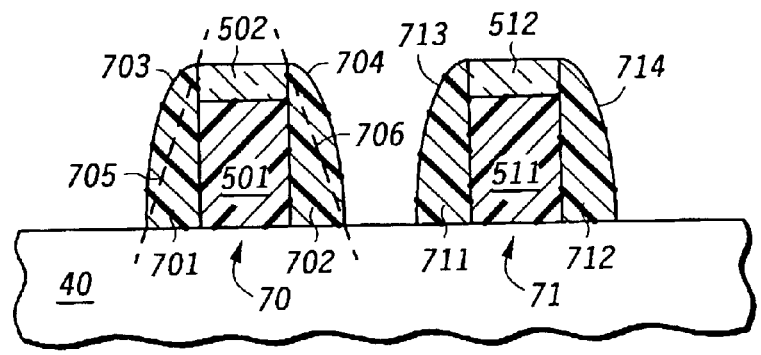

In FIG. 7 layer 60 is etched down so that a first pair of spacers (701, 702) is formed adjacent to and contiguous to vertical sidewalls (503, 504) and a second pair of spacers (711, 712) is formed adjacent to and contiguous to vertical sidewalls (513,514) of the isolation posts. Plasma-based etching, such as reactive ion etching (RIE) and HDP, is strongly recommended as the etching technique here. In this etching step, layers 502 and 512 and substrate 40 serve as effective etch stops for the etching of silicon dioxide layer 60. Note that each of the spacers (701, 702) and (711, 712) exhibits a profile that may be defined as convex. That is, both exterior surface 703 of spacer 701 and exterior surface 704 of spacer 702 extend outside respective imaginary lines 705 and 706 that connect the respective extremities of surfaces 703 and 704. As may be seen in FIG. 7, spacers 711 and 712 are similarly contructed to exhibit a profile that is convex. From an alternative perspective, spacers 701, 702, 711 and 712 may be said to be "concave down." The significance of this aspect of the isolation stacks will be revealed below.

Figure 8:
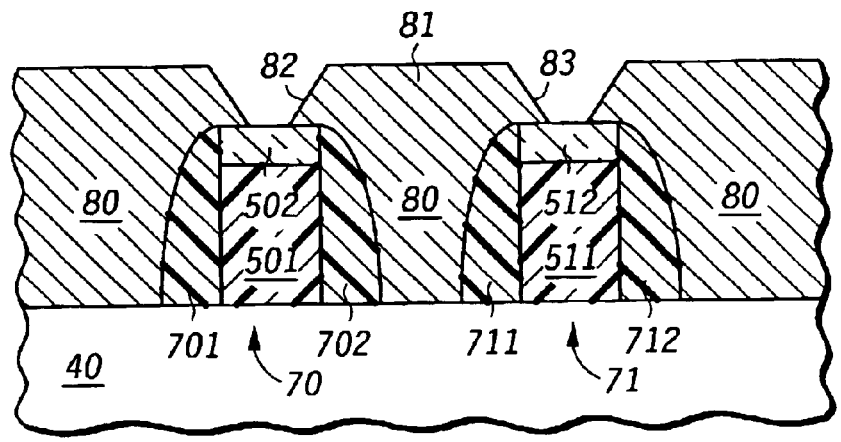

FIG. 8 depicts an intermediate structure in which semiconductor material 80 is epitaxially grown in active areas between isolation structures 70 and 71. The epitaxial material is preferably a silicon material and may be, for example Si, SiGe, SiGeC, SiC, or combinations thereof. In general, in anticipation of a CMP step to follow, epitaxial active area 80 is grown to a thickness that somewhat exceeds the height of isolation structures 70 and 71. In one embodiment, the epitaxial layer is grown with an (100) orientation and exhibits a first surface 81 extending beyond the heights of the isolation structures 70 and 71. A second surface, i.e., facet 82, joins surface 81 to a first isolation structure 70; a third surface, i.e., facet 83, joins surface 81 to a second isolation structure 71. Facets are, in general, an unavoidable consequence of an epitaxial growth process and are largely undesirable. Facets 82 and 83, in one embodiment, have a (111) orientation.

Figure 9:
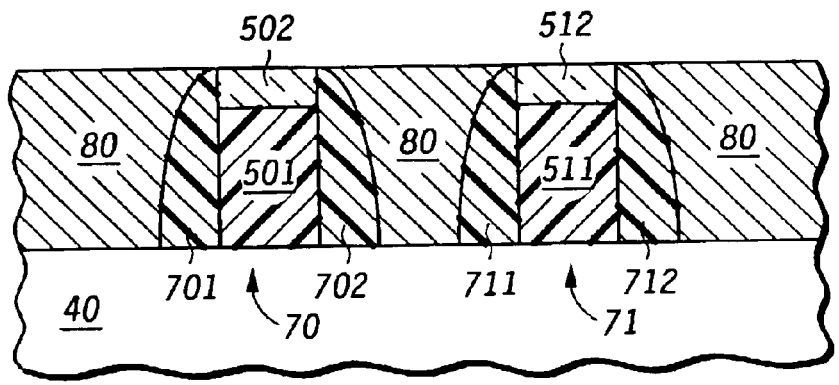
Figure 10:
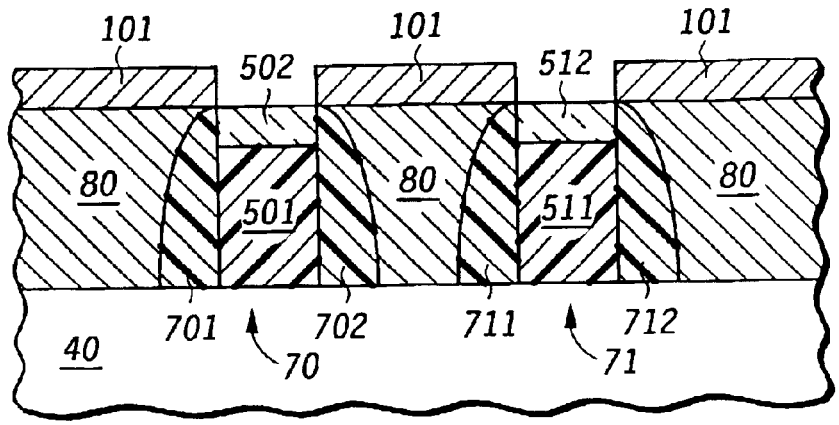
FIG. 10 depicts an alternative embodiment that pertains when active areas of the device are capped with a strained layer. If active areas are formed with the growth of SiGe, for example, capping with strained Si is warranted. Alternatively, if the active areas are Si, a SiGe, for example, capping layer is appropriate.

FIG. 9 illustrates device structure remaining after a CMP step. Note that the facets prominent in FIG. 8 have been removed.

As a mechanism to enhance the performance of active devices, a strained cap 101 may be imposed over active areas 80 of the semiconductor device. See FIG. 10. Strained cap 101 is a layer of semiconductor material that is dissimilar to the material that constitutes respective underlying active area 80. It is known that when a thin semiconductive layer is epitaxially pseudomorphologically grown on an underlying semiconductor material to which the epitaxial layer is not lattice matched, the epitaxial layer strains to match the underlying layer. So, for example, if active area 80 is formed from SiGe, as suggested above, or from Ge, then Si constitutes an appropriate material for cap layer 101. In this instance, the lattice constant of active area (be it SiGe or Ge) is greater than the lattice constant of the strained Si cap layer 101. As a result, cap layer 101 will exert a compressive force on underlying active area 80. The compressive stress so exerted is known to cause the mobility of holes in active area 80 to increase by about 60 to 80%.

Conversely, if active area 80 is formed from Si, then a material with a greater lattice constant, such as Ge or SiGe, may be used as cap layer 101. In this instance, cap layer 101 will exert a tensile force on the underlying Si active area 80. Within reasonable limits of lattice mismatch, tensile strain imposed in this manner may be operative to increase the mobility of electrons in N-channel devices by about 80% and to increase the mobility of holes in P-channel devices by about 20%. By way of comparison, no reasonable amount of lattice mismatch appears effective to induce a compressive stress that will result in an appreciable increase in election mobility. Consequently, compressive capping is largely confined to P-channel devices, but is known to be useful as a mechanism to balance the respective majority carrier mobilities of pMOS and nMOS devices in CMOS technology. However, as a general proposition, and notwithstanding the above, capping may be used to effect either a tensile strain or compressive stress on either N-type or P-type devices.

Furthermore, the combinations of materials that may be used is not particularly limited, provided that the lattice constants are dissimilar. The cap layer may have a lattice constant that is either greater than or less than the lattice constant of the underlying area. If greater than, tensile strain is exerted on the underlying layer; if less than, compressive stress is exerted on the underlying area. The maximum thickness to which the cap layer 101 may be grown before the strain is released depends on the degree of lattice mismatch and the mechanical properties of the layers. For a lattice mismatch of a few percent, this thickness is of the order of hundreds of angstroms.

As a further embellishment to the device design described heretofore, protection against threading dislocations may be had by appropriately grading the alloying concentration of active area 80. Specifically, if it assumed, for example, that substrate 40 is Si and that active area 80 is SiGe, then the formation of threading dislocations may be retarded by grading the concentration of Ge in area 80. The Ge concentration is controlled so that the concentration of Ge at the interface between substrate 40 and active area 80 is low, and increases within active area 80 as the distance from substrate 40 increases. For example, the Ge concentration may vary from approximately zero at substrate 40 to a predetermined concentration near cap layer 101. In one embodiment, the concentration of Ge may be limited in accordance with the judicious discretion of the designer, for example, to 25% near cap layer 101. Grading the concentration of Ge allows lattice mismatch between substrate 40 and active area 80 to be minimized. That is, establishing minimal Ge concentration at the interface allows substrate 40 to be substantially lattice matched to active area 80. Because lattice mismatch is a source of threading dislocations that originate at the interface, the minimization of lattice mismatch results in the corresponding suppression of threading dislocations.

Figure 2:
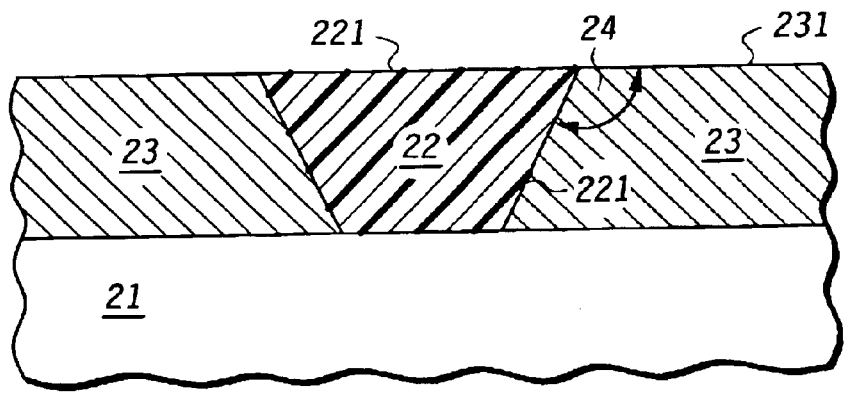
FIG. 2 is a cross-sectional view of a semiconductor device in which isolation is effected between active devices by the formation of substantially vertical trenches.
Figure 3:
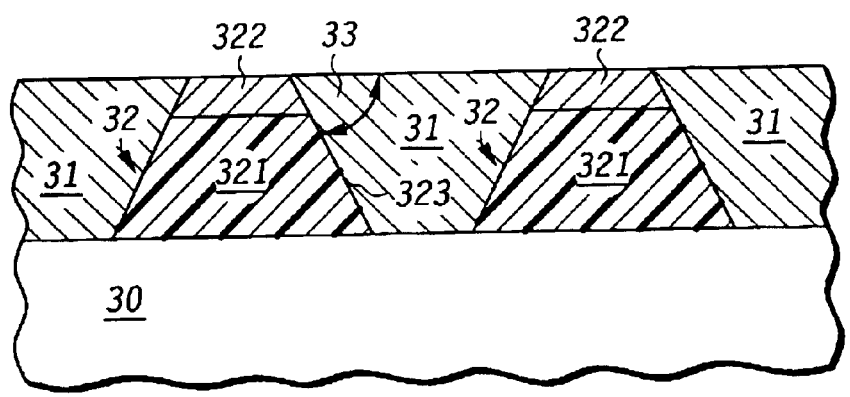
FIG. 3 is a cross-sectional view of a semiconductor device in which isolation is effected between active devices by the formation of inverted trenches, i.e., trenches having profiles that increase in width with increasing distance from the surface of the semiconductor substrate.

From the above Description it should be apparent that the subject technique, including the described device structure and fabrication process, affords numerous features, advantages and capabilities. To wit: the inverted trench structure, as realized through sidewall spacers, maintains a desired level of circuit density while providing the necessary degree of isolation between active devices. The structure is amenable to conveniently controllable and reproducible processing steps. Furthermore, the isolation structure accommodates prospective device scaling and the imposition of increasingly aggressive design rules. In addition, the convex spacer profile is particularly well conceived in that it retards the propagation of crystalline threading defects to the wafer surface. That is, with respect to vertical isolation trenches, to conventional tapered trenches (FIG. 2) and to linearly inverted tapered trenches (FIG. 3), the convex inverted trench described herein exhibits a wider profile near the interface between the device substrate and active area. Therefore, threading dislocations that originate at the interface and propagate more or less diagonally are more likely to truncate prematurely at a sidewall of a convex inverted trench than at a sidewall of the other aforementioned isolation trench types. The retardation of threading defects is always a desirable attribute, and is particularly significant in the fabrication of SiGe epitaxial devices. Furthermore, when compared to the conventional linearly tapered configuration, the convex profile of spacers (701, 702, 711, and 712) has been determined to effect a reduction in the gate capacitance of devices formed in active areas.

In the Description above, the invention has been set forth in the context of specific numerous embodiments, in a manner that is intended to be illustrative and to convey a thorough comprehension of the invention. However, one of ordinary skill in the art pertaining to the design and fabrication of semiconductor devices will appreciate that various modifications and changes may be imparted to the specifically described embodiments without departure from the scope of the invention. For example, unless specifically so stated, the invention is not to be construed as limited to the specific materials or dimensions (such as thickness, etc.) or process parameters identified herein. Similarly, those skilled in the art understand that conductivity or impurity types (P-type, N-type) may, in general, be revised, provided that requisite consistency is preserved. Consequently, the invention is to be understood as embracing all subject matter included within the literal scope of the appended claims, as well as equivalents thereof. Accordingly, the Description and the Figures are properly construed are illustrative of the invention, rather than delimiting, and all modifications to or departures from them are consequently comprehended by the scope of the subject invention.

Similarly, benefits, advantages, capabilities and solutions to operational or other technical challenges have been enumerated with respect to the specific embodiments of the invention, as provided herein. However, the benefits, advantages, capabilities and solutions, and any elements(s) or limitation(s) that give rise to any such benefit, advantage, capability and solution, or that enable or cause the same to become more pronounced, are not to be considered or construed as a critical, required, or essential element or limitation of any or all of the claims, either expressly or by implication or estoppel. Furthermore, as used herein, the terms "comprises," "comprising," or any variation thereof, are intended to apply nonexclusively, so that a process, method, article or apparatus that comprises a recited enumeration of elements includes not only recited elements but also other elements not explicitly recited or enumerated but inherent to such process, method, article, or apparatus.

We claim:

1. A semiconductor device fabricated in accordance with a process comprising:

providing a semiconductor substrate, the substrate having a surface;

forming a plurality of composite isolation posts on the surface, each post disposed at a respective position on the surface and extending vertically a respective height from the surface;

depositing an insulating material over the posts and over areas of the surface between the posts;

etching the insulating material so as to form convex sidewalls contiguous to respective vertical surface of the posts; and growing semiconductor material on the surface between the sidewalls.

2. A semiconductor device as defined in claim 1, wherein the semiconductor material is grown to a thickness that is greater than the respective heights of the isolation posts.

3. A semiconductor device as defined in claim 2, wherein the process further comprises:

removing an amount of the semiconductor material so that the semiconductor material retains a thickness approximately equal to the respective heights of the isolation posts.

4. A semiconductor device as defined in claim 1, wherein the grown semiconductor material is an epitaxial layer of material selected from the group of materials consisting of Si, SiGe, SiGeC, SiC and combination thereof.

5. A semiconductor device as defined in claim 1, further comprising:

growing a strained cap over the grown epitaxial layer.

6. A semiconductor device as defined in claim 5, wherein the epitaxial layer is Si and the strained cap is SiGe.

7. A semiconductor device as defined in claim 5, wherein the epitaxial layer SiGe and the strained cap is Si.

8. A semiconductor device as defined in claim 1, wherein:

the substrate material is Si; and the grown epitaxial layer is SiGe having a graded Ge concentration that increases in a direction upward from the surface.

9. A semiconductor device comprising:

a substrate having a surface; and a plurality of isolation structures disposed at predetermined position on the surface, wherein each isolation structures comprises:

a vertical stack having first and second sidewalls;

a pair of insulating convex sidewall spacers respectively disposed contiguous to the first and the second sidewalls; and semiconductor material disposed between the isolation structures.

10. A semiconductor device as defined in claim 9, wherein the vertical stack comprises:

a first layer over the substrate; and a second layer over the first layer.

11. A semiconductor device as defined in claim 10, wherein the first layer is an insulation layer and the second layer is an etch stop layer.

12. A semiconductor device as defined in claim 9, further comprising epitaxial semiconductor material disposed between the isolation structures.

13. A semiconductor device as defined in claim 12, further comprising:

a strained cap over the epitaxial semiconductor material.

14. A semiconductor device as defined in claim 13, wherein the strained cap layer has a lattice constant that is greater than the lattice constant of the epitaxial semiconductor material so that a tensile strain is exerted on the epitaxial semiconductor material.

15. A semiconductor device as defined in claim 13, wherein the strained cap layer has a lattice constant that is less than the lattice constant of the epitaxial semiconductor material so that a compressive stress is exerted on the epitaxial semiconductor material.

16. A semiconductor device as defined in claim 12, wherein the vertical stack comprises:

a first layer over the substrate; and a second layer over the first layer.

17. A semiconductor device as defined in claim 16, wherein the first layer is $SiO_2$ and the second layer is $Si_3N_4$.

18. An intermediate structure formed in the process of fabricating a semiconductor device, the intermediate structure comprising:

a substrate having a surface;

at least a pair of isolation structures disposed at respective predetermined positions on the surface, wherein each isolation structure comprises a vertical stack having a first sidewall and a second sidewall and comprises a pair of insulating convex sidewall spacers respectively disposed on the substrate contiguous to the first sidewall and to the second sidewall; and semiconductor material disposed between the isolation structures for forming active areas of the semiconductor device, the semiconductor material having a first surface above the vertical stack, a second surface joining the first surface to the vertical stack of a first isolation structure, and a third surface joining the first surface to the vertical stack of a second isolation structure.

19. An intermediate structure as defined in claim 18, wherein the first surface exhibits the lattice orientation (100).

20. An intermediate structure as defined in claim 19, wherein the second surface exhibits the lattice orientation (111).

* * * * *